(12) United States Patent
Han et al.

(10) Patent No.: US 11,263,933 B2
(45) Date of Patent: Mar. 1, 2022

(54) LED PANEL AND DISPLAY APPARATUS HAVING THE SAME

(71) Applicant: SAMSUNG ELECTRONICS CO., LTD., Suwon-si (KR)

(72) Inventors: Seung Ryong Han, Yongin-si (KR); Shunsuke Kimura, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/169,429

(22) Filed: Oct. 24, 2018

(65) Prior Publication Data

US 2019/0122592 A1 Apr. 25, 2019

(30) Foreign Application Priority Data

Oct. 25, 2017 (KR) .................. 10-2017-0139011
Oct. 24, 2018 (KR) .................. 10-2018-0127789

(51) Int. Cl.
| | | |
|---|---|---|
| *G09F 9/302* | (2006.01) | |
| *H01L 25/075* | (2006.01) | |
| *G09G 3/32* | (2016.01) | |
| *G06F 3/14* | (2006.01) | |
| *H01L 33/52* | (2010.01) | |

(52) U.S. Cl.
CPC .......... *G09F 9/3026* (2013.01); *G06F 3/1446* (2013.01); *G09G 3/32* (2013.01); *H01L 25/0753* (2013.01); *G09G 2300/026* (2013.01); *H01L 33/52* (2013.01)

(58) Field of Classification Search
CPC .......... G02F 1/33; G09F 9/302; G06F 3/1446; G09G 2300/026
See application file for complete search history.

(56) References Cited

U.S. PATENT DOCUMENTS

| | | | | |
|---|---|---|---|---|
| 5,661,531 A | * | 8/1997 | Greene | ............. G02F 1/133512 |
| | | | | 349/73 |
| 5,838,405 A | | 11/1998 | Izumi et al. | |
| 6,873,380 B2 | | 3/2005 | Matthies et al. | |
| 10,192,950 B2 | * | 1/2019 | Jung | ................... H01L 27/3293 |
| 2009/0073080 A1 | * | 3/2009 | Meersman | .......... G02F 1/13336 |
| | | | | 345/1.3 |

(Continued)

FOREIGN PATENT DOCUMENTS

| | | |
|---|---|---|
| JP | 2009-258455 A | 11/2009 |
| KR | 10-2008-0078263 A | 8/2008 |
| KR | 10-2015-0111808 A | 10/2015 |

OTHER PUBLICATIONS

Tokihiko Shinomiya et al., "Direct Viewing 40-Inch (1m) Diagonal TFT-LCD by Seamless Connection Technique", Dec. 1997, pp. 81-84.

(Continued)

*Primary Examiner* — Sepehr Azari
(74) *Attorney, Agent, or Firm* — Sughrue Mion, PLLC

(57) ABSTRACT

An LED panel includes a panel body having a substrate, a plurality of LED elements and a mold, and a light absorbing layer formed at a lateral side of the panel body to absorb at least one of ambient light or light emitted from the plurality of LED elements. The light absorbing layer prevents a seam formed by a gap between the adjacent LED panels from being visible. The light absorbing layer absorbs the external light incident on the gap or absorbs the light emitted from the LED element to the gap.

17 Claims, 16 Drawing Sheets

(56) References Cited

U.S. PATENT DOCUMENTS

2010/0190280 A1\* 7/2010 Horiuchi ............. H01L 21/6836
                                                                                   438/28
2010/0277064 A1    11/2010 Cok et al.
2011/0057861 A1    3/2011 Cok et al.
2016/0018708 A1\*  1/2016 Kanda ............... G02F 1/134309
                                                                                   257/254
2017/0250164 A1    8/2017 Takeya et al.
2017/0286044 A1    10/2017 Kim et al.
2018/0190631 A1\*  7/2018 Kim .................... G02F 1/13336

OTHER PUBLICATIONS

Communication dated Feb. 18, 2019 issued by the European Patent Office in European counterpart Application No. 18202548.6.
International Search Report dated Feb. 25, 2019 issued by the International Searching Authority in counterpart International Application No. PCT/KR2018/012674 (PCT/ISA/210).
Communication dated Dec. 16, 2019 by the European Patent Office in counterpart European Patent Application No. 18202548.6.

\* cited by examiner

LED PANEL AND DISPLAY APPARATUS HAVING THE SAME

CROSS-REFERENCE TO RELATED APPLICATION(S)

This application is based on and claims priority under 35 U.S.C. § 119 to Korean Patent Application Nos. 10-2017-0139011, filed on Oct. 25, 2017 and 10-2018-0127789, filed on Oct. 24, 2018, in the Korean Intellectual Property Office, the disclosures of which are incorporated by reference herein in their entireties.

BACKGROUND

1. Field

The disclosure relates to a light emitting diode (LED) display apparatus using an LED panel.

2. Description of Related Art

A display apparatus is an output device that visually displays data information such as characters, graphics, and images.

The display apparatus can be classified into a light emitting type using a display panel which emits light by itself such as an LED panel, and a light receiving type using a display panel which cannot emit light by itself and needs to receive light from a backlight unit, such as a liquid crystal panel.

When a large-sized display apparatus is manufactured, a large-sized display panel corresponding to the size thereof is provided. However, increasing the size of the display panel is limited due to technical problems such as yield. Accordingly, it is possible to utilize modular display technology that tiles smaller-sized display panels continuously up, down, left, and right to produce a large-sized screen when a large-sized display apparatus is produced.

In the case of a liquid crystal panel, a driving unit for driving a pixel is disposed in an outer portion of the liquid crystal panel. Therefore, it is difficult to apply such module display technology due to a bezel area generated along with the driving unit when the liquid crystal panel is tiled.

On the other hand, since the driving unit of the LED panel is disposed on the rear surface of a substrate, it is easier to apply the module display technology than to the liquid crystal panel. However, when the LED panel is tiled, a minute gap is generated between the adjacent LED panels, and a seam is visible due to the gap, so that deterioration in image quality and a sense of heterogeneity may occur.

SUMMARY

In accordance with an aspect of the disclosure, there is provided an LED display apparatus in which the seam by the gap between adjacent LED panels is prevented from being seen by a human.

In accordance with an aspect of the disclosure, there is provided an LED display apparatus in which deterioration in image quality at the edge of a screen is prevented or minimized.

In accordance with an aspect of the disclosure, an LED panel includes a panel body having a substrate and a plurality of LED elements provided at a front side of the substrate, and a mold provided at the front side of the substrate to cover the plurality of LED elements; and a light absorbing layer formed at a lateral side of the panel body to absorb at least one of ambient light or light emitted from the plurality of LED elements.

The panel body may include a front light absorbing layer formed at the front side of the substrate.

The front light absorbing layer may be formed at a portion of the substrate except for an area where the plurality of LED elements are formed.

The LED panel according to claim 1, wherein the light absorbing layer is formed at a portion of the lateral side of the panel body between a lateral side of the substrate and a lateral side of the mold.

The LED panel according to claim 1, wherein the light absorbing layer is formed at both a lateral side of the substrate and a lateral side of the mold.

The LED panel according to claim 5, wherein the light absorbing layer partially covers a lateral side of the mold.

The LED panel may further include a front edge light absorbing layer extending from the light absorbing layer and formed on a front side of the panel body to cover a corner between a front surface and a lateral surface of the panel body.

A distance between the lateral surface of the panel body and a center line of an LED element, which is disposed closest to the lateral surface of the panel body among the plurality of LED elements, may correspond to a half of a pitch between the plurality of LED elements.

The LED element may include an element electrode and the substrate may be provided with a substrate electrode electrically connected to the element electrode, and the panel body may include a conductive adhesive layer to electrically connect the element electrode to the substrate electrode.

The conductive adhesive layer may include an anisotropic conductive film (ACF).

The conductive adhesive layer may formed on an entire area of the substrate.

The conductive adhesive layer may be formed to cover the substrate electrode with a predetermined pattern.

In accordance with an aspect of the disclosure, an LED display apparatus includes a cabinet; and a plurality of LED panels installed in the cabinet, at least one of the plurality of LED panels including a panel body having a substrate and a plurality of LED elements provided at a front side of the substrate, and a mold provided at the front side of the substrate to cover the plurality of LED elements; and a light absorbing layer formed at a lateral side of the panel body to absorb at least one of ambient light or light emitted from the plurality of LED elements.

The molds of the plurality of LED panels may be spaced apart from each other.

The molds of the plurality of LED panels may be integrated with each other.

The panel body may include a front light absorbing layer formed at the front side of the substrate.

The front light absorbing layer may include gap covering pattern to cover a gap between the plurality of LED panels.

BRIEF DESCRIPTION OF DRAWINGS

The above and/or other aspects will become more apparent by describing certain embodiments with reference to the accompanying drawings, in which.

DETAILED DESCRIPTION

Figure 1:
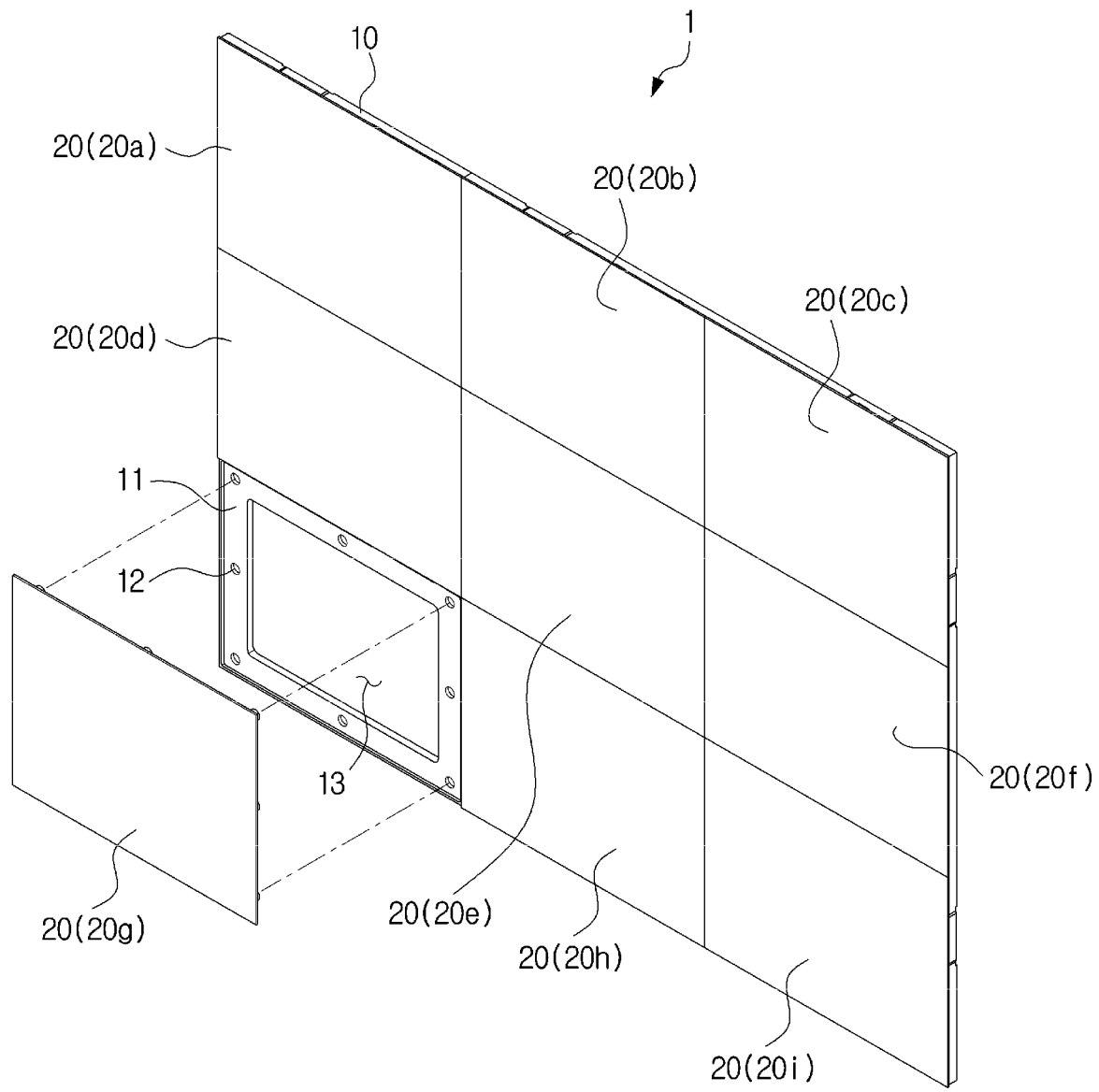
FIG. 1 is a view showing an LED display apparatus according to an embodiment.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments may be practiced without those specifically defined matters. Also, well-known functions or constructions are not described in detail since they would obscure the description with unnecessary detail.

The singular representation used in the description may include plural representations unless the context clearly dictates otherwise. The drawings may be exaggerated for clarity, such as the shape and size of the elements.

It is to be understood that the terms comprising, including or having in the present specification is intended to mean that there are features, numbers, steps, operations, elements, parts or combinations thereof described in the specification, and it is to be understood that it does not preclude the presence or addition of one or more other features, numbers, steps, operations, elements, components, or combinations thereof.

Figure 2:
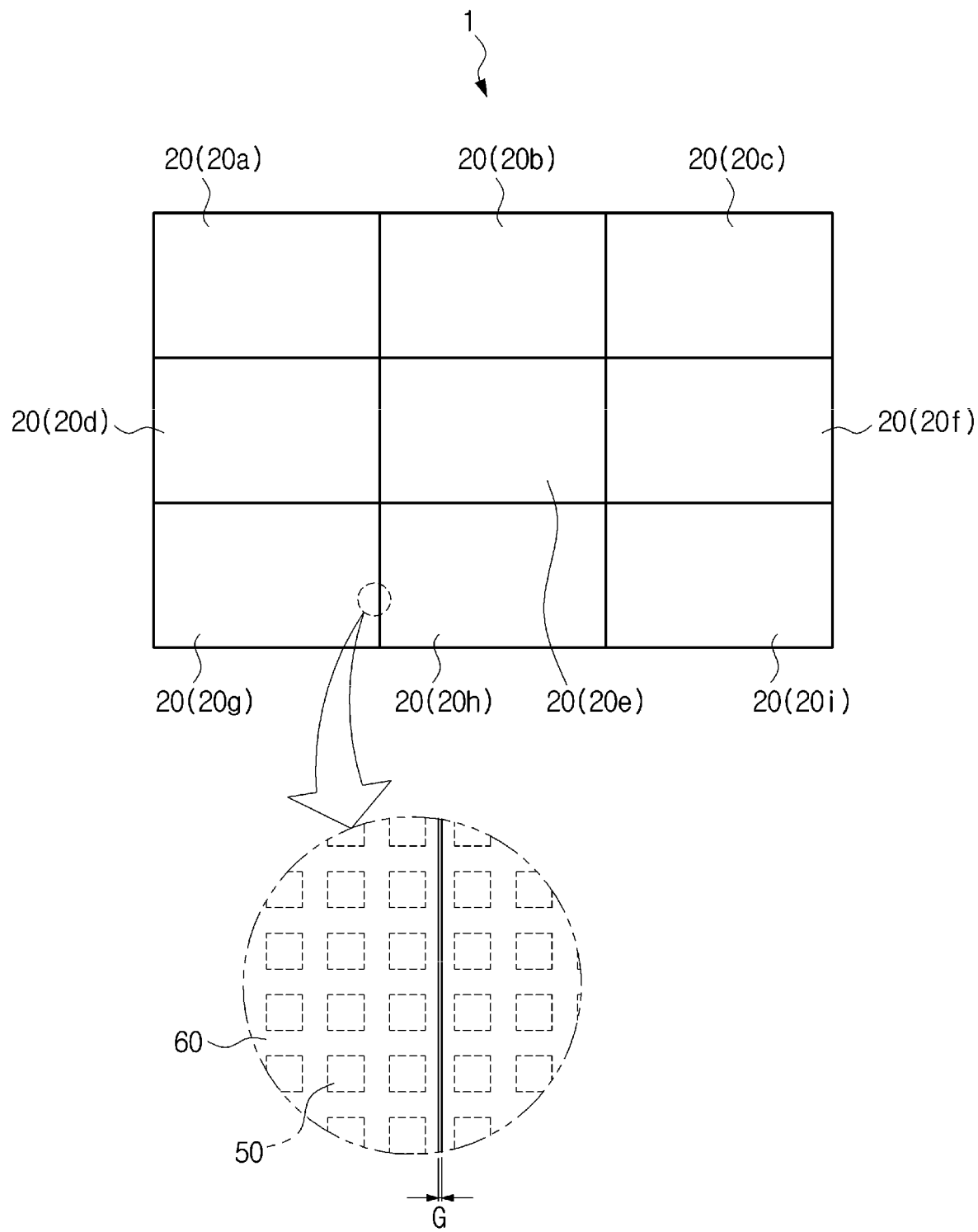
FIG. 2 is a view showing a plurality of LED panels of the LED display apparatus of FIG. 1.
Figure 3:
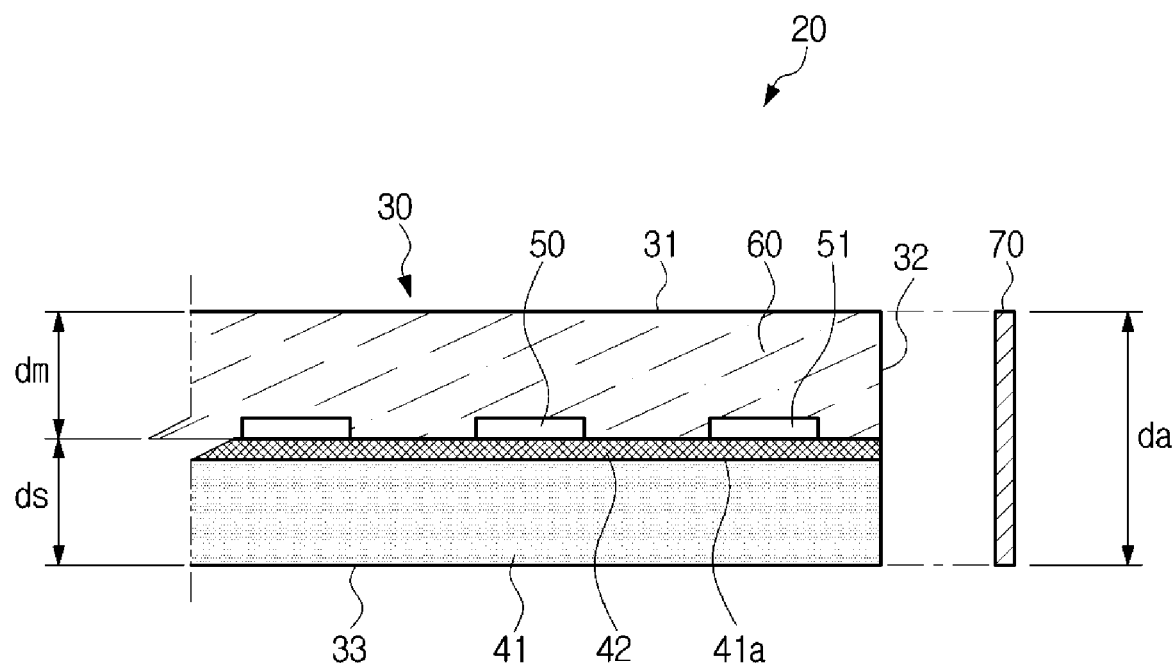
FIG. 3 is a side cross-sectional view of the LED panel of the LED display apparatus of FIG. 1.
Figure 4:
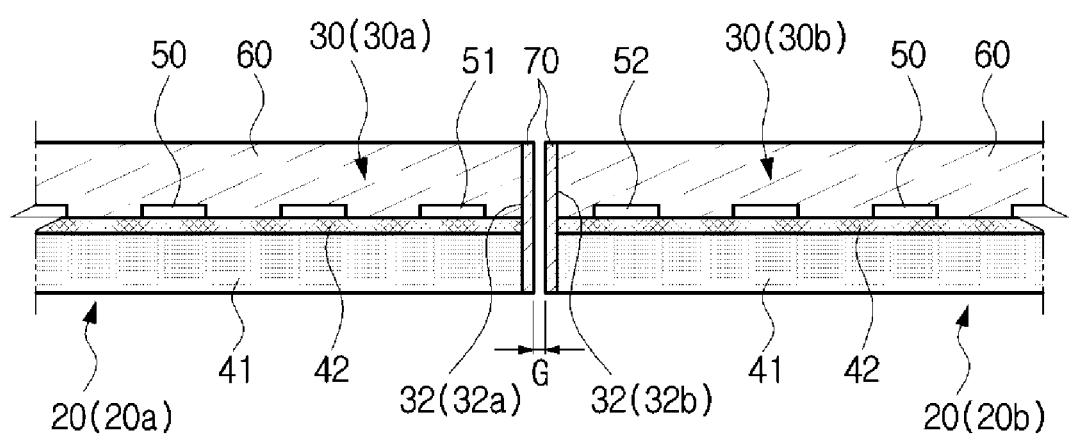
FIG. 4 is a side cross-sectional view of the plurality of adjacent LED panels of the LED display apparatus of FIG. 1.
Figure 5:
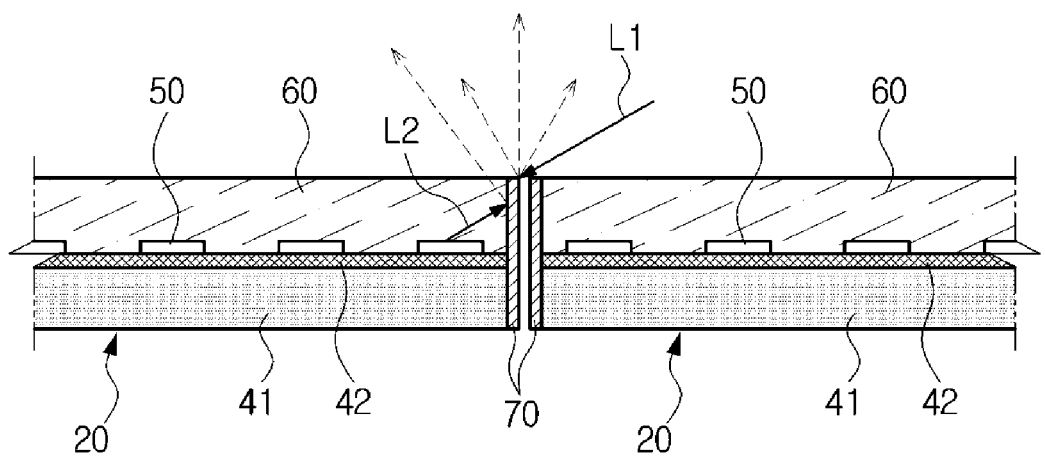
FIG. 5 is a view showing the function of a lateral light absorbing layer of the LED display apparatus of FIG. 1.

FIG. 1 is a view showing an LED display apparatus according to an embodiment. FIG. 2 is a view showing a plurality of LED panels of the LED display apparatus of FIG. 1. FIG. 3 is a side cross-sectional view of the LED panel of the LED display apparatus of FIG. 1. FIG. 4 is a side cross-sectional view of the plurality of adjacent LED panels of the LED display apparatus of FIG. 1. FIG. 5 is a view showing the function of a lateral light absorbing layer of the LED display apparatus of FIG. 1.

An LED display apparatus 1 is a device for displaying information and data in the form of characters, figures, graphs, images, etc., and a billboard, a screen, a television, a monitor, and the like can be implemented as the LED display apparatus 1. The LED display apparatus may be installed on indoor or outdoor ground via a stand or on a wall through a hanger.

The LED display apparatus 1 includes a frame or a cabinet 10, a plurality of LED panels 20 installed in the cabinet 10, a control board for driving the plurality of LED panels 20, and a power supply unit for supplying power to the LED panels 20.

The cabinet 10 supports the plurality of LED panels 20 and can form a part of an outer appearance of the LED display apparatus 1. The cabinet 10 may have a base plate 11 on which the plurality of LED panels 20 are mounted. The base plate 11 may be provided with an opening 13 for transmitting driving signals and power to the LED panels 20 and a mounting portion 12, e.g., an opening, a groove, a magnet, etc., for mounting the plurality of LED panels 20. The plurality of LED panels 20 may be installed in the cabinet 10 in various appropriate ways, e.g., via a screw, a bolt, a magnet, etc. that match with the mounting portion 12. As another example, the plurality of LED panels 20 may be installed by applying an adhesive layer or an adhesive tape to the edge of the panels, or via an adhesive filled in at least one groove, i.e., the mounting portion 12.

The plurality of LED panels 20 may be arranged in a matrix array on the base plate 11. In an embodiment, the LED display apparatus 1 includes nine LED panels 20a to 20i arranged in a 3×3 matrix. However, there are no restrictions on the number or arrangement of LED panels. Each of the LED panels 20 can be independently installed in the cabinet 10 or can be separated.

In an embodiment, the LED panels 20 may have a flat shape but may be curved or may have a variable curvature.

The LED panels 20 may include a panel body 30. The panel body 30 has a front surface 31, a back surface 33 and a lateral surface or lateral surfaces 32, e.g., upper, lower, left, and right lateral surfaces, connecting the front surface 31 and the back surface 33. A lateral light absorbing layer 70 may be provided on the lateral surface 32 of the panel body 30. The panel body 30 may have a substantially rectangular thin plate shape. However, the shape of the panel body 30 is not limited to a quadrangle, but may be formed in various shapes according to the shape of the LED display apparatus 1 and the arrangement of the LED panels 20.

The panel body 30 includes a substrate 41, a front light absorbing layer 42 formed on a front surface 41a of the substrate 41, a plurality of LED elements 50 mounted on the front surface 41a of the substrate 41, and a mold 60 which is provided to surround the plurality of LED elements 50.

The substrate 41 may have a shape corresponding to the shape of the LED display apparatus 1 and may be formed of glass, polyimide (PI), FR4 material, or the like.

The front light absorbing layer 42 may be formed in the entire front surface region of the substrate 41 to absorb external light to improve the contrast. The front light absorbing layer 42 may be formed using the same material and method as the lateral light absorbing layer 70.

The plurality of LED elements 50 may be mounted on the substrate 41 in a matrix arrangement. Each of the plurality of LED elements 50 may form one pixel. Each of the plurality of LED elements 50 may include red LEDs, green LEDs, and blue LEDs, which are subpixels. The plurality of LED elements 50 are arranged to have a predetermined spacing and the spacing between the LED elements 50 can be variously determined according to the resolution and size of the LED display apparatus 1.

It is possible to reduce the size of the LED element 50 and to reduce the interval between the LED elements 50 in order to display a high-quality image. However, the smaller the distance between the LED elements 50 is, the better a seam between the LED panels 20 can be seen.

If the interval between the plurality of LED elements 50 is referred to as the pitch P, the distance from the outermost LED element 51 closest to the lateral surface 32 of the panel body 30 to the lateral surface 32 of the panel body 30 corresponds to approximately half of the pitch P between the LED elements 50. The pitch P of the plurality of LED elements 50 may be approximately 300 to 500 micrometers.

The spacing between an outermost LED element 51 of one of the LED panels 20, e.g., the LED panel 20a, and an outermost LED element 52 of another adjacent LED panel 20b is equal to the pitch P between the LED elements 50.

The mold 60 has a structure for protecting the LED element 50. The mold 60 is formed by applying the molding member onto the substrate 41 through a dispensing process or the like after the LED element 50 is mounted on the substrate 41. The molding member may be an acrylic resin, a polyimide resin, an epoxy resin, a polyurethane resin, or the like as a translucent or fluorescent material in a liquid state at room temperature.

The mold 60 may be formed to cover all of the LED elements 50 mounted on the substrate 41. The mold 60 may be formed to have a uniform overall thickness. The thickness da of the panel body 30 may correspond to the sum of the thickness ds of the substrate 41 and the front light absorbing layer 42 and the thickness dm of the mold 60.

When the plurality of LED panels 20 are installed in the cabinet 10, a minute gap G may be generated between the adjacent LED panels 20, and the seam can be recognized because of the gap G, i.e., the gap may be perceived as a seam to the naked eye due to light reflection. The gap G may be formed to have a length of approximately 20 to 100 micrometers.

For example, when the LED display apparatus 1 is turned off, the external light is irregularly reflected at the gap G, so that the seam can be visually recognized. In addition, when the LED display apparatus 1 is turned on, the light emitted from the LED element 50 is reflected by the gap G and is leaked so that the seam can be visually recognized. As the seam is recognized, heterogeneity may occur or image quality may be deteriorated.

At least one LED panel 20 among the LED panels 20 according to an embodiment of the disclosure includes the lateral light absorbing layer 70 provided on the lateral surface 32 of the panel body 30 to prevent the seam from being visible or to minimize the visibility of the seam.

As shown in FIG. 4, the lateral light absorbing layer 70 may be provided on any one of the plurality of LED panels 20a and 20b. The LED panel 20a has a first lateral surface 32a and the LED panel 20b has a second lateral surface 32b. The first lateral surface 32a and the second lateral surface 32b face each other with the gap G interposed therebetween.

The lateral light absorbing layer 70 may be formed on one lateral surface of the panel body 30, to face the other LED panel 20, among the upper, lower, right, and left lateral surfaces. However, the disclosure is not limited thereto and the lateral light absorbing layer 70 may be formed on all or some of the upper, lower, left, and right lateral surfaces of the panel body 30.

The lateral light absorbing layer 70 may be formed by coating the lateral surface 32 of the panel body 30 with a light absorbing material. The light absorbing material may include a black inorganic material, a black organic material, a black metal, etc., which absorbs light to maximize the light absorbing effect.

For example, the light absorbing material may be selected from the group consisting of carbon black, polyene-based pigments, azo-based pigments, azomethine-based pigments, diimmonium-based pigments, phthalocyanine-based pigments, quinone-based pigments, indigo-based pigments, thioindigo-based pigments, dioxadin-based pigments, quinacridone-based pigments, isoindolinone-based pigments, metal oxides, metal complexes, and other aromatic hydrocarbons.

The lateral light absorbing layer 70 may be formed by attaching a light absorbing material to the lateral surface 32 of the panel body 30, e.g., by an application of adhesive layer, adhesive tape, etc. For example, the light absorbing material may be composed of a light absorbing film and an adhesive material and attached to the lateral surface 32 of the panel body 30.

The light absorbing material may be formed to have a gray series according to the color of the substrate 41 and the front light absorbing layer 42.

The lateral light absorbing layer 70 may be formed from the front end to the rear end of the lateral face 32 of the panel body 30. For example, the length da of the lateral light absorbing layer 70 may correspond to the sum of the thickness ds of the substrate and the front light absorbing layer and the thickness dm of the mold 60. In other words, the lateral light absorbing layer 70 may be formed on the entire lateral side 32 of the panel body 30.

Figure 6:
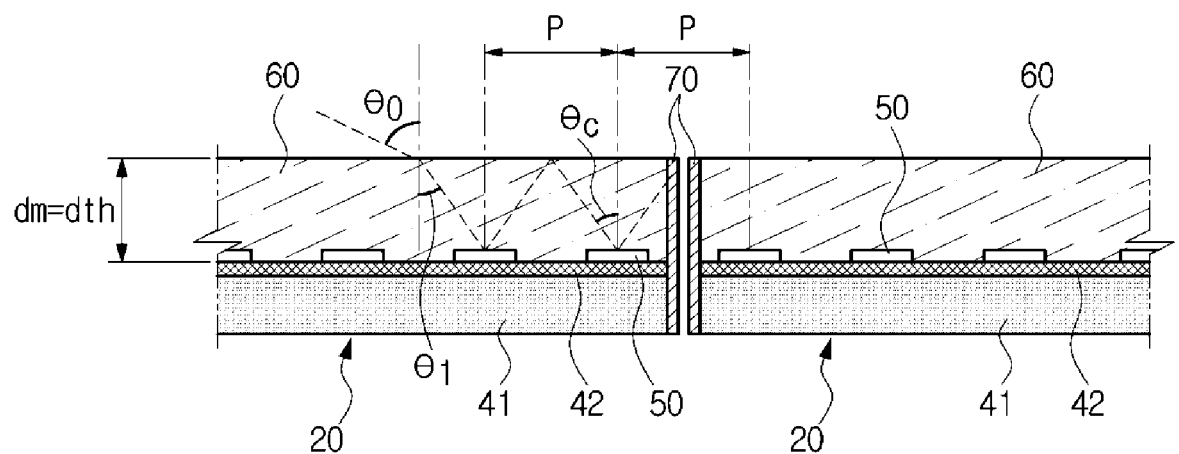
FIG. 6 is a view showing an embodiment in which a thickness dm of a mold of the LED display apparatus of FIG. 1 corresponds to a threshold thickness (dth).
Figure 7:
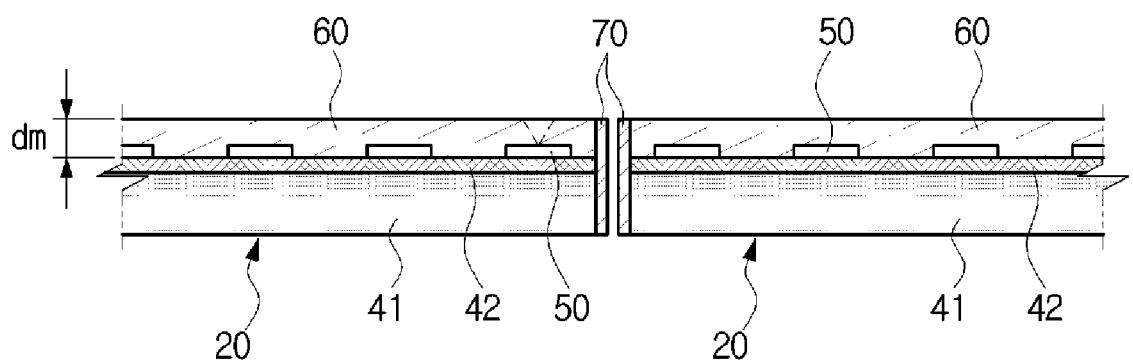
FIG. 7 is a view showing an embodiment in which the thickness dm of the mold of the LED display apparatus of FIG. 1 is smaller than dth.
Figure 8:
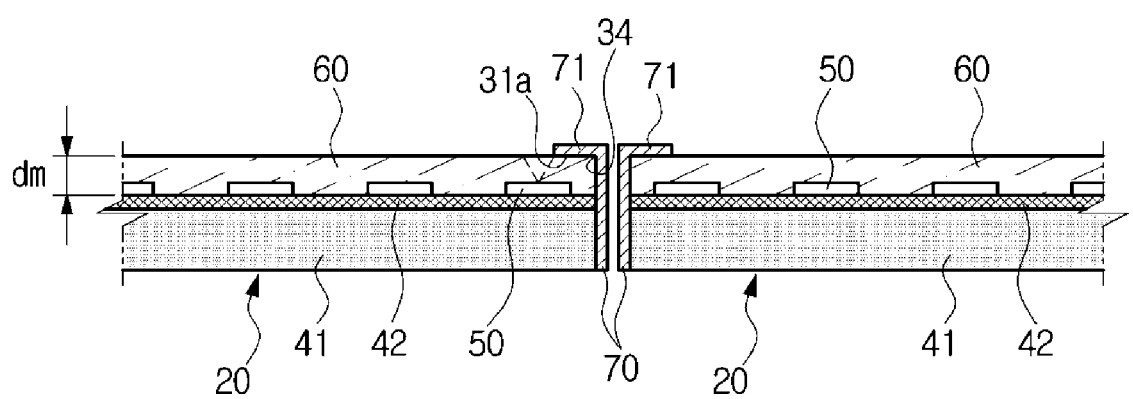
FIG. 8 is a view showing an embodiment in which a front edge light absorbing layer is formed on a front edge of the mold when the thickness dm of the mold of the LED display apparatus of FIG. 1 is smaller than dth.
Figure 9:
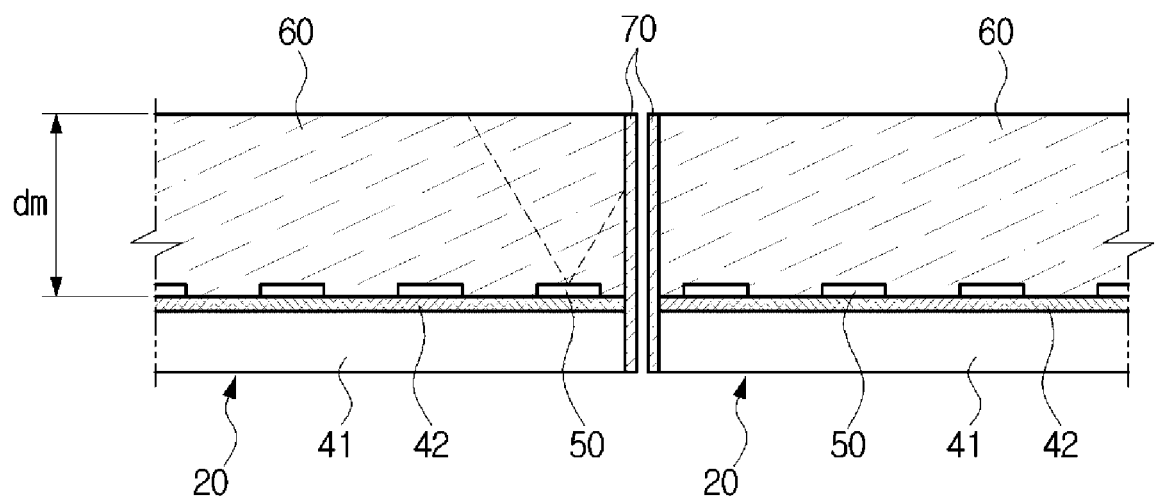
FIG. 9 is a view showing an embodiment in which the thickness dm of the mold of the LED display apparatus of FIG. 1 is larger than dth.
Figure 10:
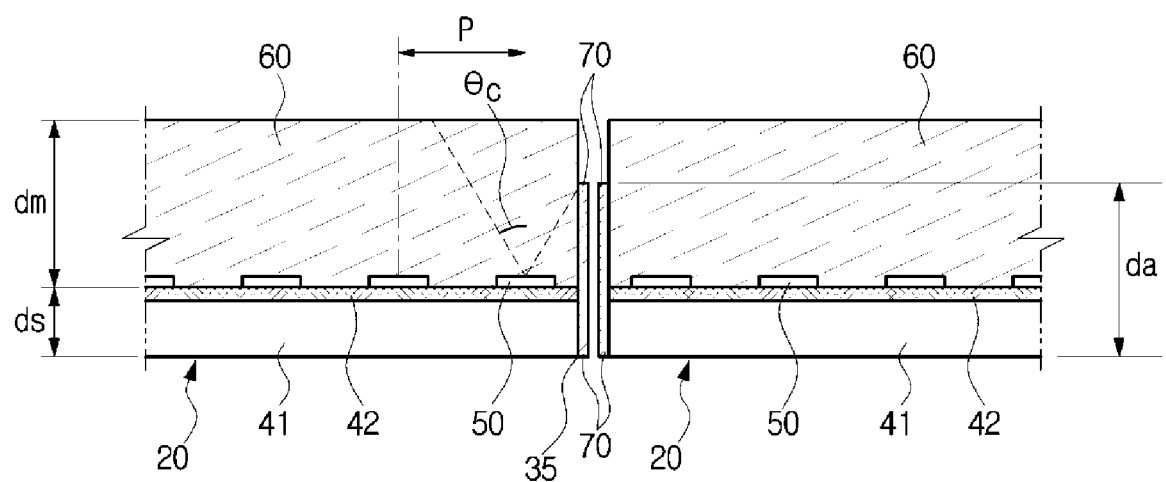
FIG. 10 is a view showing an embodiment in which the light absorbing layer is provided only in a part of a lateral surface of a panel body when the thickness dm of the mold of the LED display apparatus of FIG. 1 is larger than dth.

FIG. 5 is a view showing the function of a lateral light absorbing layer of the LED display apparatus of FIG. 1. FIG. 6 is a view showing an embodiment in which a thickness dm of a mold of the LED display apparatus of FIG. 1 corresponds to a threshold thickness dth. FIG. 7 is a view showing an embodiment in which the thickness dm of the mold of the LED display apparatus of FIG. 1 is smaller than dth. FIG. 8 is a view showing an embodiment in which a front edge light absorbing layer is formed on a front edge of the mold when the thickness dm of the mold of the LED display apparatus of FIG. 1 is smaller than dth. FIG. 9 is a view showing an embodiment in which the thickness dm of the mold of the LED display apparatus of FIG. 1 is larger than dth. FIG. 10 is a view showing an embodiment in which the light absorbing layer is provided only in a part of a lateral surface of a panel body when the thickness dm of the mold of the LED display apparatus of FIG. 1 is larger than dth.

As shown in FIG. 5, the lateral light absorbing layer 70 absorbs an external light L1 incident on the gap G in a state where the LED display apparatus 1 is off and prevents diffused reflection (see the dotted line in FIG. 5) from occurring. It is also possible to prevent a light L2 from leaking (see the dotted line in FIG. 5) by absorbing the light L2, for example, emitted from the LED element 50 to the gap G in a state where the LED display apparatus 1 is turned on. By doing so, the seam may be made not recognizable or the visibility of the seam may be substantially minimized.

When the front light absorbing layer 70 is applied to the panel body 30 according to an embodiment of the disclosure, the thickness dm needs to be appropriately determined in order to secure the beamforming of the light emitted from the LED element 50 and to eliminate the shadowing.

With reference to FIGS. 6 and 7, when the thickness dm of the mold 60 is equal to or less than the threshold thickness dth, the beamforming of the light emitted from the LED element 50 is ensured and the shadowing phenomenon does not appear.

Here, equation $$dth = \frac{P}{2\tan\theta c}$$

is satisfied, where p is the pitch between the LED elements 50, and $\theta_c$ is an angle, e.g., a critical angle, at which total reflection occurs when light travels from the mold 60 to the air.

The critical angle $\theta_c$ can be determined according to the refractive indices of the mold 60 and the air. Assuming that the refractive index of the mold 60 is n1, the refractive index of the air is n0, the incident angle is θ1, and the refraction angle is θ2, $$\theta c = \sin^{-1}\frac{n0}{n1}$$

can be determined by the formula of n0×sin θ0=n1×sin θ1.

As shown in FIG. 8, the LED panel 20 may further include a front edge light absorbing layer 71 extending from the lateral light absorbing layer 70 and formed on the front edge 31a of the mold 60 when $$dm < dth = \frac{P}{2\tan\theta c}$$

is satisfied.

The front edge light absorbing layer 71 can be extended from the lateral light absorbing layer 70 to ensure beamforming of light emitted and to prevent occurrence of shadowing. Therefore, the corner 34 corner between a front surface and a lateral surface of the panel may be covered by the lateral light absorbing layer 70 and the front edge light absorbing layer 71. The front edge light absorbing layer 71 efficiently absorbs the external light L1 incident on the gap G and prevents the leakage of the light L2, for example, emitted from the LED element 50 to the gap G.

As shown in FIG. 9, when the thickness dm of the mold 60 is larger than the threshold thickness dth, a part of the light emitted from the LED element 50 is blocked by the lateral light absorbing layer 70 and beamforming is not ensured and a shadowing phenomenon may occur.

When the thickness dm of the mold 60 is larger than the threshold thickness dth, the lateral light absorbing layer 70 is formed only in a part of the side surface 32 of the panel body 30 in order to secure the beamforming and prevent the shadowing phenomenon from occurring. That is, the lateral light absorbing layer 70 may be formed at the entire lateral side of the substrate 41 and a part of the lateral side of the mold 60.

For example, as shown in FIG. 10, the lateral light absorbing layer 70 is formed forward from the rear end 35 of the panel body 30, and the thickness da of the lateral light absorbing layer 70 can be determined to satisfy the following equation:

$$da = ds + \frac{P}{2\tan\theta c}$$

When this relationship is established, the lateral light absorbing layer 70 does not block the light emitted from the LED element 50 from traveling into the air, so that the beamforming is ensured and the shadowing does not occur.

Figure 11:
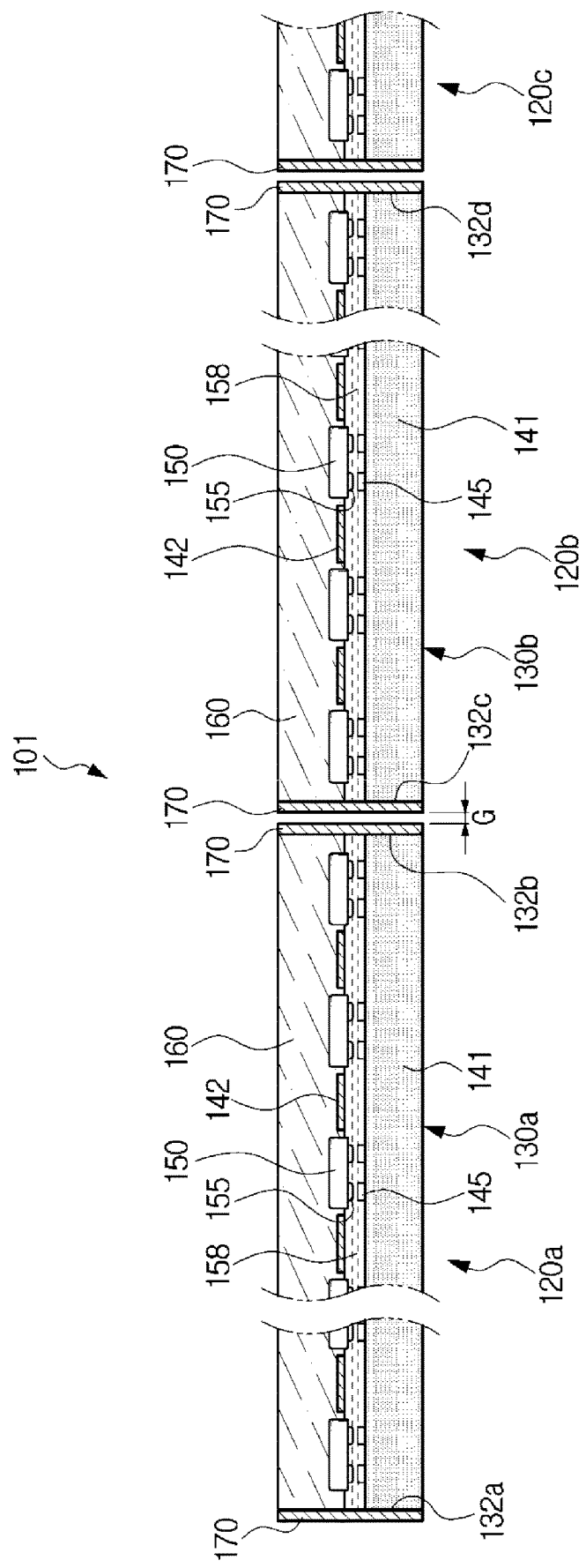
FIG. 11 is a view showing an LED display apparatus according to another embodiment.

FIG. 11 is a view showing an LED display apparatus according to another embodiment.

Referring to FIG. 11, an LED display apparatus according to another embodiment will be described. In the following description, the same reference numerals are used to designate the same elements, and details of parts identical to those of the previous embodiment will be omitted.

As shown in FIG. 11, the lateral light absorbing layer 170 may be formed not only at the lateral side facing the lateral side of the other LED panel but also on the lateral side not facing the lateral side of the other LED panel. That is, the lateral light absorbing layer 170 may be formed at the outer lateral side of the LED panel, which is located outermost among the plurality of LED panels. With this configuration, it is possible to prevent or minimize deterioration of the image quality of the edge portion of the LED display apparatus 101. In addition, it is possible to prevent or minimize occurrence of a sense of heterogeneity in the screen edge portion of the LED display apparatus 101.

Specifically, the LED display apparatus 101 may include a cabinet and a plurality of LED panels installed in the cabinet.

The plurality of LED panels may include an LED panel 120a located at the outermost side and an LED panel 120b adjacent to the LED panel 120a. The LED panel 120b may be positioned between the LED panel 120a and an LED panel 120c.

The LED panel 120a may include a panel body 130a and lateral light absorbing layers 170 provided on the lateral sides 132a and 132b of the panel body 130a.

The LED panel 120b may include a panel body 130b and lateral light absorbing layers 170 provided on the lateral sides 132c and 132d of the panel body 130b.

The lateral light absorbing layer 170 may absorb at least one of ambient light or light emitted from the plurality of LED elements 150.

Each of the panel bodies 130a and 130b includes a substrate 141, a plurality of LED elements 150 mounted at a front side of the substrate 141, and a mold 160 provided at the front side of the substrate 141 to cover the plurality of LED elements 150.

The plurality of LED elements 150 are formed of an inorganic material, and may include an inorganic light emitting element having a height and width of several micrometers to hundreds of micrometers. The plurality of LED elements 150 are picked up from a silicon wafer and are transferred on the conductive adhesive layer 158.

The plurality of LED elements 150 each may have a light emitting structure including an n-type semiconductor, an active layer, a p-type semiconductor, and a pair of element electrodes 155. The pair of element electrodes 155 may be arranged in the same direction to form a flip chip shape.

The substrate 141 may be provided thereon with a pair of substrate electrodes 145 that are electrically connected to the pair of element electrodes 155.

The panel bodies 130a and 130b may include a conductive adhesive layer 158 formed on the substrate 141 to electrically connect the substrate 141 to the plurality of LED elements 150. The conductive adhesive layer 158 may be formed on the entire region of the substrate 141.

The conductive adhesive layer 158 may mediate the electrical connection between the pair of element electrodes 155 and the pair of substrate electrodes 145. The conductive adhesive layer 158 may include an anisotropic conductive film (ACF). The ACF is an anisotropic adhesive attached on a protective film, with conductive balls distributed on an adhesive resin. The conductive ball is a conductive sphere surrounded by a thin insulating membrane, and when supplied with a pressure, the insulating membrane is broken, causing the conductive balls to be electrically connected one another.

As such, when the element electrodes 155 of the plurality of LED elements 150 are electrically connected to the substrate electrodes 145 of the substrate 141 using the conductive adhesive layer 158, the LED elements 150 are prevented from being damaged in the adhesion process, the reliability of adhesion is improved, and the adhesion process is facilitated.

The panel bodies 130a and 130b may include a front light absorbing layer 142 formed at the front side of the substrate 141. The front light absorbing layer 142 may be formed at a portion of the substrate 141 except for an area where a plurality of LED elements 150 are formed.

The front light absorbing layer 142 may be formed between the plurality of LED elements 150 in a predetermined pattern. The front light absorbing layer 142 may be formed in a lattice pattern.

Figure 12:
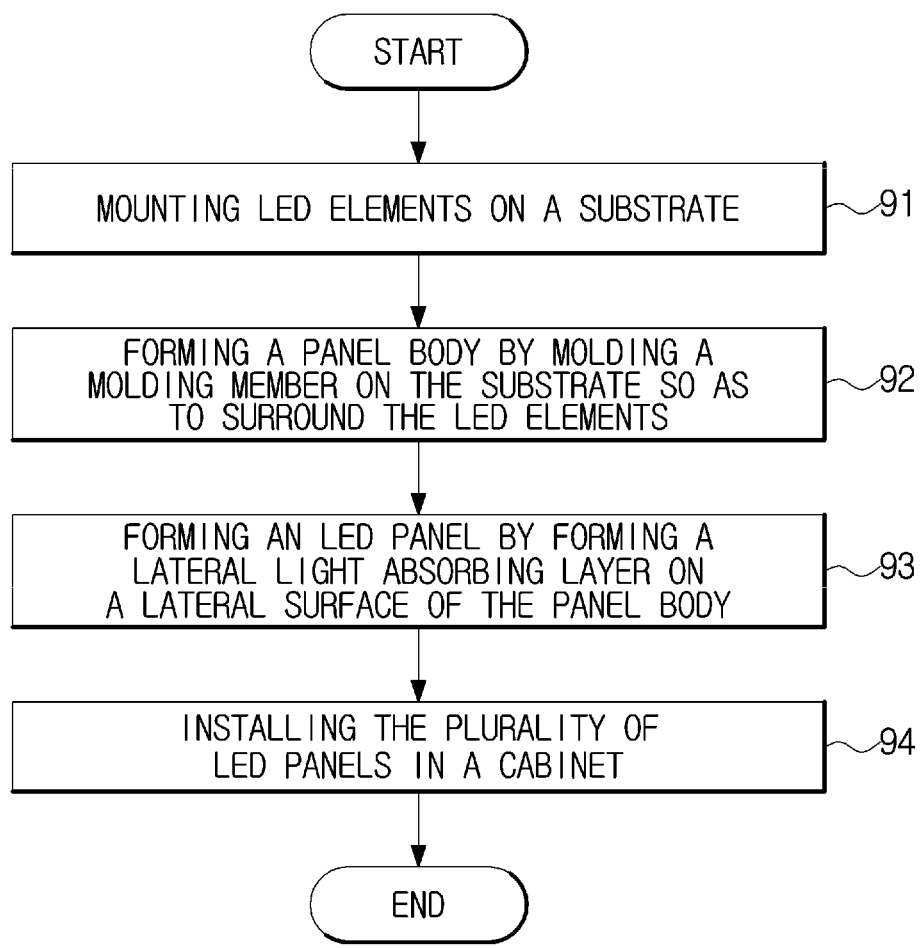
FIG. 12 is a flowchart showing a manufacturing method of the LED display apparatus of FIG. 1.

FIG. 12 is a flowchart showing a manufacturing method of the LED display apparatus of FIG. 1.

In operation 91, a plurality of LED elements 50 are mounted in a matrix array on a substrate 41 on which a front light absorbing layer 42 is formed in order to form the LED panel 20.

In operation 92, a mold 60 is formed by molding a molding member on the substrate 41 to surround a plurality of LED elements 50. The mold 60 can be formed by applying a liquid molding member onto the substrate 41 through a dispensing process or the like. When the mold 60 is hardened, the substrate 41, the front light absorbing layer 42, the LED elements 50, and the mold 60 form the panel body 30. The panel body 30 may have a substantially rectangular thin plate shape having a front surface 31, a rear surface 33 and upper, lower and left and right lateral surfaces 32 connecting the front surface 31 and the rear surface 33.

In operation 93, a lateral light absorbing layer 70 is formed on the lateral surface 32 of the panel body 30 to form an LED panel 20. The lateral light absorbing layer 70 may be formed by coating a light absorbing material on the lateral surface 32 of the panel body 30 or attaching a light absorbing material.

In operation 94, the plurality of LED panels 20 are installed in the cabinet 10 in a matrix arrangement.

Figure 13:
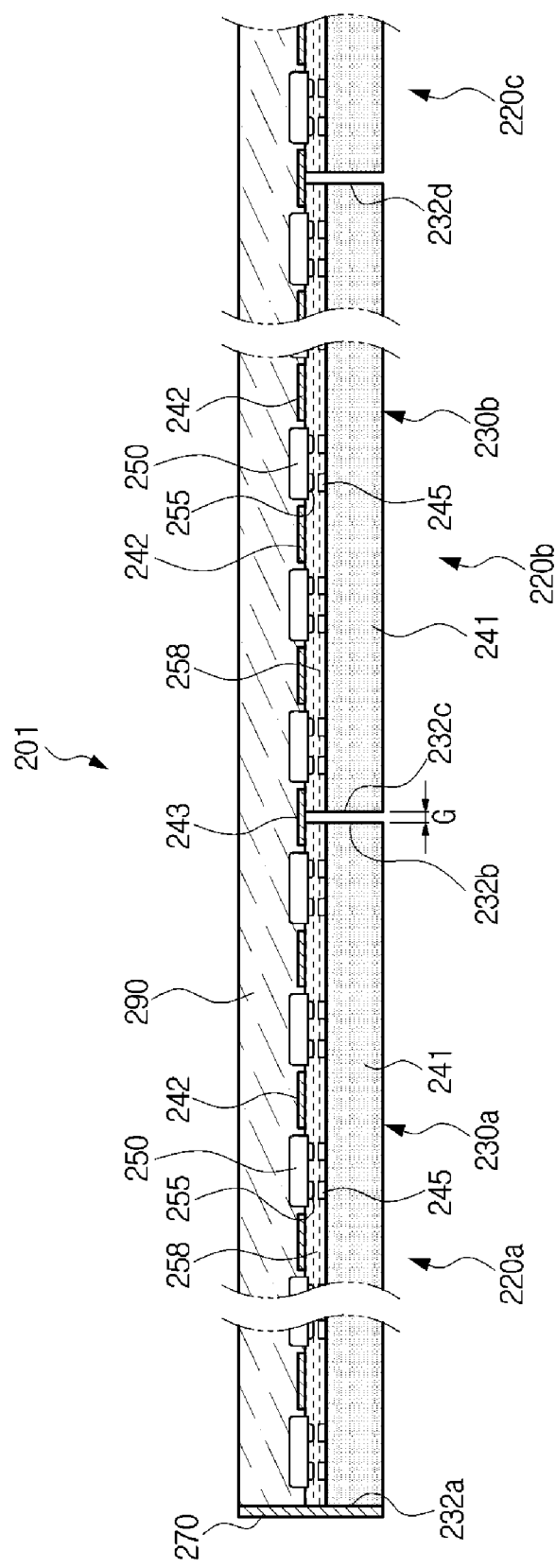
FIG. 13 is a view showing an LED display apparatus according to another embodiment.

FIG. 13 is a view showing an LED display apparatus according to another embodiment.

Referring to FIG. 13, an LED display apparatus 201 according to another embodiment will be described. In the following description, the same reference numerals are used to designate the same elements, and details of parts identical to those of the previous embodiment will be omitted.

Unlike the above-described embodiment, the molds of the plurality of LED panels may be formed to be integrated with each other. That is, an integrated mold 290 may be formed as a single body at the front sides of the plurality of substrates so as to cover the all of the LED elements 250 of the LED display apparatus 201.

Specifically, the LED display apparatus 201 may include a cabinet and a plurality of LED panels installed in the cabinet.

The plurality of LED panels may include an LED panel 220a located at the outermost side and an LED panel 220b adjacent to the LED panel 220a. The LED panel 220b may be positioned between the LED panel 220a and an LED panel 220c.

The LED panel 220a may include a panel body 230a and a lateral light absorbing layer 270 provided on the lateral side 232a of the panel body 230a.

The LED panel 220b may include a panel body 230b.

In this embodiment, the lateral light absorbing layer is not formed at an inner lateral side 232b of the panel body 230a and opposite lateral sides 232c and 232d of the panel body 230b but the disclosure is not limited thereto.

The lateral light absorbing layer 270 may absorb at least one of ambient light or light emitted from the plurality of LED elements 250.

As shown in FIG. 13, the lateral light absorbing layer 270 may be formed at the entire lateral side 232a of the panel body 230a. However, the disclosure is not limited thereto, and the lateral light absorbing layer 270 may be formed at a portion of the lateral side of the panel body 230a except for a portion of the lateral side of the mold 290. Alternatively, the lateral light absorbing layer 270 may be formed at the entire lateral side of the substrate 241 and a portion of the lateral side of the mold 290. Further, the LED panel 220a may include a front edge light absorbing layer that extends from the light absorbing layer 270 and formed on a front side of the panel body 230a to cover a corner between the front surface and a lateral surface of the panel body 230a.

Each of the panel bodies 230a and 230b includes a substrate 241, a plurality of LED elements 250 mounted at a front side of the substrate 241, and an integrated mold 290 formed at the front side of the substrate to cover the plurality of the LED elements 250. The integrated mold 290 may be formed as a single boy at the front sides of the plurality of substrates 241 to cover all of the LED elements 250 of the LED display apparatus 201. Therefore, the molds 290 of the LED panels adjacent to each other are integrated formed.

The plurality of LED elements 250 each may have a pair of element electrodes 255. The substrate 241 may be provided thereon with a pair of substrate electrodes 245 that are electrically connected to the pair of element electrodes 255.

The panel bodies 230a and 230b may include a conductive adhesive layer 258 formed on the substrate 241 to electrically connect the substrate 241 to the plurality of LED elements 250. The conductive adhesive layer 258 may be formed on the entire region of the substrate 241.

The panel bodies 230a and 230b may include a front light absorbing layer 242 formed at the front side of the substrate 241. The front light absorbing layer 242 may be formed at a portion of the substrate 241 except for an area where the plurality of LED elements 250 are formed.

The front light absorbing layer 242 may be formed between the plurality of LED elements 250 in a predetermined pattern. The front light absorbing layer 242 may be formed in a lattice pattern.

The front light absorbing layer 242 may include a gap covering pattern 243 to cover a gap G between the plurality of LED panels. The gap covering pattern 243 may prevent the ambient light and the light emitted from the plurality of LED elements 250 from entering the gap G between the plurality of LED panels. In addition, the gap covering pattern 243 may physically prevent a molding resin from penetrating into the gap G when forming the integrated mold 290.

Figure 14:
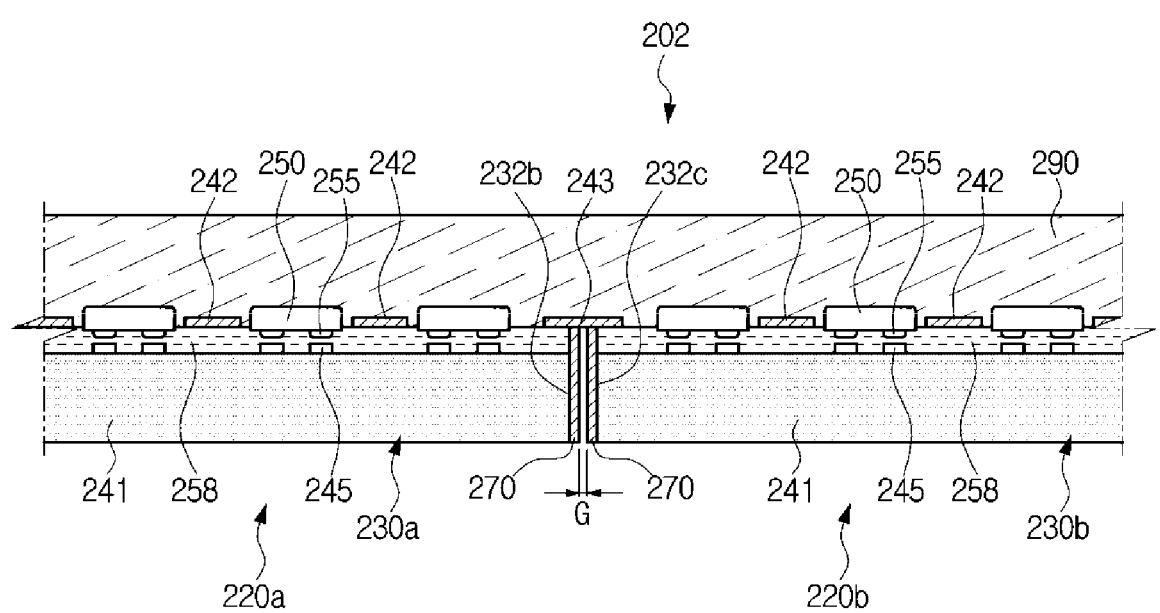
FIG. 14 is a cross-sectional view showing an embodiment in which a lateral light absorbing layer is formed in a gap region of the LED display apparatus of FIG. 13.

FIG. 14 is a cross-sectional view showing an embodiment in which a lateral light absorbing layer is formed in a gap region of the LED display apparatus of FIG. 13.

Referring to FIG. 14, another embodiment will be described. In the following description, the same reference numerals are used to designate the same elements, and details of parts identical to those of the previous embodiment will be omitted.

Unlike the above-described embodiment of FIG. 13, the lateral light absorbing layer 270 may be formed in a region of the gap G between the plurality of LED panels of the LED display apparatus 202. That is, the lateral light absorbing layer 270 may be formed at the lateral side 232*b* of the panel body 230*a* and the lateral side 232*c* of the panel body 230*b*, as shown in FIG. 14. The lateral side 232*b* of the panel body 230*a* and the lateral side 232*c* of the panel body 230*b* may be lateral sides facing each other with the gap G interposed therebetween.

The lateral light absorbing layer 270 may be formed on a portion of the lateral side of the panel body 230*a* except for the lateral side of the mold 290. That is, the lateral light absorbing layer 270 may be formed at the lateral side of the substrate 241 and the conductive adhesive layer 258, or may be formed only at the lateral side of the substrate 241.

Figure 15:
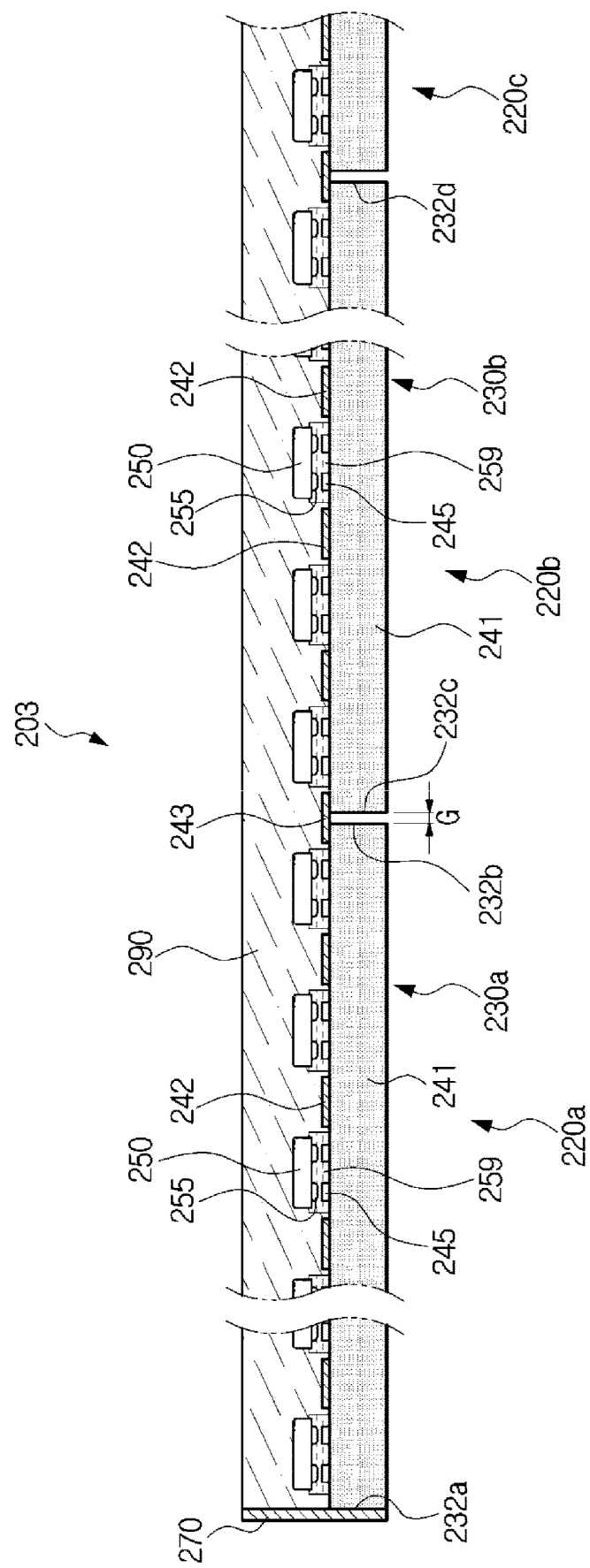
FIG. 15 is a cross-sectional view showing an LED display apparatus having a conductive adhesive layer according to another embodiment.

FIG. 15 is a cross-sectional view showing an LED display apparatus 203 having a conductive adhesive layer according to another embodiment.

Referring to FIG. 15, another embodiment will be described. In the following description, the same reference numerals are used to designate the same elements, and details of parts identical to those of the previous embodiment will be omitted.

Unlike the above-described embodiment of FIG. 13, a conductive adhesive layer 259 is not formed on the entire area of the substrate 241, but formed on only a part of the area. That is, as shown in FIG. 15, the conductive adhesive layer 259 may be formed on only a region so as to cover the substrate electrodes 245.

Figure 16:
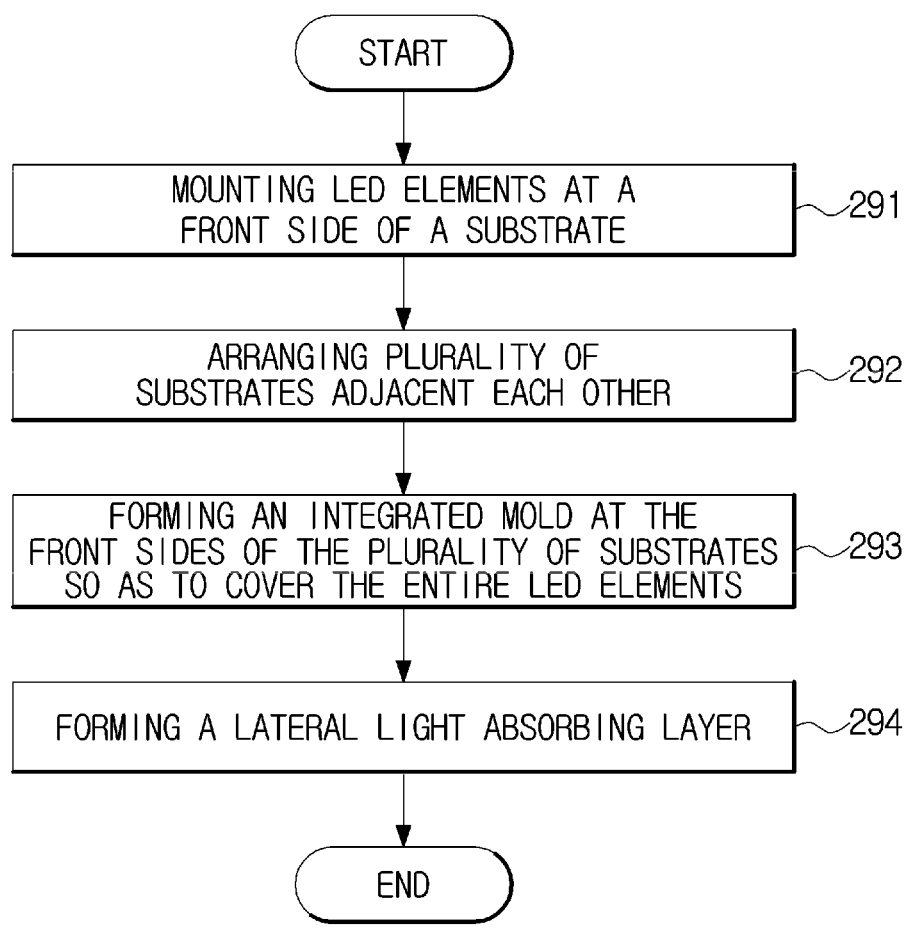
FIG. 16 is a flowchart showing a manufacturing method of an LED display according to another embodiment.

FIG. 16 is a flowchart showing a manufacturing method of an LED display according to another embodiment.

In operation 291, a plurality of LED elements 250 are mounted at a front side of a substrate 241. Conductive adhesive layers 258 and 259 may be formed on the substrate 241 to electrically connect the substrate 241 to the LED elements 250. A front light absorbing layer 242 may be formed between the plurality of LED elements 250 in a predetermined pattern.

In operation 292, a plurality of substrates 241 are disposed adjacent to each other.

In operation 293, an integrated mold 290 is formed at the front sides of the plurality of substrates 241 to cover the entirety of the plurality of LED elements 250. In operation 294, the lateral light absorbing layer 270 is formed at an outer lateral side 232*a* of an LED panel 220*a* located at the outermost among the plurality of LED panels.

In the above-described LED display apparatus, the image quality can be improved since a seam created by a gap between adjacent LED panels is prevented from being seen by a naked eye or the visibility of the seam may be substantially minimized.

In the above-described LED display apparatus, deterioration in image quality at the edge of a screen may be prevented or minimized.

Although the disclosure has been described with reference to specific embodiments, it is not limiting. The present teaching may be readily applied to other types of apparatuses. Also, the description of the embodiments is intended to be illustrative, and not to limit the scope of the claims, and many alternatives, modifications, and variations will be apparent to those skilled in the art.

What is claimed is:

1. A light emitting diode (LED) panel comprising:
   a panel body comprising a substrate and a plurality of LED elements provided at a front side of the substrate; and
   a light absorbing layer formed at a lateral side of the panel body to absorb at least one of ambient light or light emitted from the plurality of LED elements,
   wherein each of the plurality of LED elements comprises:
     an element structure comprising:
       a first lateral surface,
       a second lateral surface opposing the first lateral surface,
       a bottom surface which faces the substrate and connects the first and second lateral surfaces, and
       a front surface which opposes the bottom surface and connects the first and second lateral surfaces, and
     a pair of element electrodes which are formed at the bottom surface of the element structure and arranged in the same direction,
   wherein the panel body further comprises:
     a conductive adhesive layer provided as a continuous layer extending between the substrate and the bottom surface of the element structure of the plurality of LED elements, respectively, so that the pair of element electrodes, in their entireties, that are formed at the bottom surface of the element structure, and lower portions of the first and second lateral surfaces and the bottom surface of the element structure of each of the plurality of LED elements are immersed in the conductive adhesive layer, so that the first and second lateral surfaces are only partially immersed in the conductive adhesive layer,
     a front light absorbing layer formed as portions between pairs of adjacent LED elements among the plurality of LED elements at a front side of the conductive adhesive layer, respectively, and
     a mold layer which is provided on the front side of the substrate and covers the plurality of LED elements,
   wherein the substrate is provided with pairs of substrate electrodes respectively corresponding to each pair of element electrodes of each of the plurality of LED elements,
   wherein each of the pairs of the substrate electrodes faces its corresponding pair of element electrodes and is electrically connected inside the conductive adhesive layer to its corresponding pair of element electrodes,
   wherein each of the portions of the front light absorbing layer is sandwiched between the first lateral surface of one LED element of one of the pairs of adjacent LED elements and the second lateral surface of another LED element of the one of the pairs of adjacent LED elements at the front side of the conductive adhesive layer,
   wherein, based on a thickness of the mold layer being less than or equal to a threshold value, a thickness of the light absorbing layer is configured to correspond to a thickness of the panel body, wherein, based on the thickness of the mold layer being greater than the threshold value, the thickness of the light absorbing layer is configured to be less than the thickness of the panel body, and wherein the threshold value is directly proportional to a pitch between the plurality of LED elements, respectively.

2. The LED panel according to claim 1, wherein the front light absorbing layer is formed at a portion of the substrate except for an area where the plurality of LED elements are formed.

3. The LED panel according to claim 1, wherein the light absorbing layer is formed at a portion of the lateral side of the panel body between a lateral side of the substrate and a lateral side of the mold layer.

4. The LED panel according to claim 1, wherein the light absorbing layer is formed at both a lateral side of the substrate and a lateral side of the mold layer.

5. The LED panel according to claim 4, wherein, based on the thickness of the mold layer being greater than the threshold value, the light absorbing layer partially covers the lateral side of the mold layer.

6. The LED panel according to claim 1, wherein the light absorbing layer extends to a front side of the panel body to cover a corner formed between a front surface and a lateral surface of the panel body.

7. The LED panel according to claim 6, wherein a distance between the lateral surface of the panel body and a center line of an LED element, which is disposed closest to the lateral surface of the panel body among the plurality of LED elements, corresponds to a half of the pitch between the plurality of LED elements.

8. The LED panel according to claim 1, wherein the conductive adhesive layer comprises an anisotropic conductive film (ACF).

9. The LED panel according to claim 1, wherein the conductive adhesive layer is formed on an entire area of the substrate.

10. The LED panel according to claim 1, wherein the conductive adhesive layer is formed to cover the pairs of the substrate electrodes with a predetermined pattern.

11. The LED panel according to claim 1, wherein each of the pairs of the substrate electrodes is separated from its corresponding pair of element electrodes by a gap, and the gap is filled with the conductive adhesive layer.

12. The LED panel according to claim 1, wherein the element structure includes an n-type semiconductor, an active layer, and a p-type semiconductor.

13. A light emitting diode (LED) display apparatus, comprising:

a cabinet; and a plurality of LED panels installed in the cabinet, at least one of the plurality of LED panels comprising:

a panel body comprising a substrate and a plurality of LED elements provided at a front side of the substrate; and a light absorbing layer formed at a lateral side of the panel body to absorb at least one of ambient light or light emitted from the plurality of LED elements, wherein each of the plurality of LED elements comprises:

an element structure comprising:

a first lateral surface, a second lateral surface opposing the first lateral surface, a bottom surface which faces the substrate and connects the first and second lateral surfaces, and a front surface which opposes the bottom surface and connects the first and second lateral surfaces, and a pair of element electrodes formed at the bottom surface of the element structure and arranged in the same direction, wherein the panel body further comprises:

a conductive adhesive layer provided as a continuous layer extending between the substrate and the bottom surface of the element structure of the plurality of LED elements, respectively, so that the pair of element electrodes, in their entireties, that are formed at the bottom surface of the element structure, and lower portions of the first and second lateral surfaces and the bottom surface of the element structure of each of the plurality of LED elements are immersed in the conductive adhesive layer, so that the first and second lateral surfaces are only partially immersed in the conductive adhesive layer, a front light absorbing layer formed as portions between pairs of adjacent LED elements among the plurality of LED elements, respectively, at a front side of the conductive adhesive layer, and a mold layer which is provided on the front side of the substrate and covers the plurality of LED elements, wherein the substrate is provided with pairs of substrate electrodes respectively corresponding to each pair of element electrodes of each of the plurality of LED elements, wherein each of the pairs of the substrate electrodes faces its corresponding pair of element electrodes and is electrically connected inside the conductive adhesive layer to its corresponding pair of element electrodes, wherein each of the portions of the front light absorbing layer is sandwiched between the first lateral surface of one LED element of one of the pairs of adjacent LED elements and the second lateral surface of another LED element of the one of the pairs of adjacent LED elements at the front side of the conductive adhesive layer, wherein, based on a thickness of the mold layer being less than or equal to a threshold value, a thickness of the light absorbing layer is configured to correspond to a thickness of the panel body, wherein, based on the thickness of the mold layer being greater than the threshold value, the thickness of the light absorbing layer is configured to be less than the thickness of the panel body, and wherein the threshold value is directly proportional to a pitch between the plurality of LED elements, respectively.

14. The LED display apparatus according to claim 13, wherein the mold layer comprises molds individually provided to each of the plurality of LED panels, and the molds of the plurality of LED panels are spaced apart from each other.

15. The LED display apparatus according to claim 13, wherein the mold layer is an integrated mold provided to cover the plurality of LED panels.

16. The LED display apparatus according to claim 15, wherein the front light absorbing layer comprises a gap covering pattern to cover a gap between two adjacent LED panels among the plurality of LED panels.

17. The LED display apparatus according to claim 16, wherein the gap is formed between two adjacent substrates of the two adjacent LED panels and comprises no material disposed between the two adjacent substrates.

* * * * *